(12) United States Patent
Takao et al.

(10) Patent No.: US 11,621,185 B2
(45) Date of Patent: Apr. 4, 2023

(54) SEMICONDUCTOR MANUFACTURING APPARATUS AND METHOD FOR TRANSFERRING WAFER

(71) Applicant: Tokyo Electron Limited, Tokyo (JP)

(72) Inventors: Rintaro Takao, Hokkaido (JP); Naohide Ito, Iwate (JP); Hiroaki Dewa, Hokkaido (JP); Masayuki Kozawa, Hokkaido (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 37 days.

(21) Appl. No.: 17/177,382

(22) Filed: Feb. 17, 2021

(65) Prior Publication Data

US 2021/0287920 A1 Sep. 16, 2021

(30) Foreign Application Priority Data

Mar. 16, 2020 (JP) .............................. JP2020-045740

(51) Int. Cl.
*H01L 21/677* (2006.01)
*H01L 21/68* (2006.01)
*B65G 49/07* (2006.01)
*H01L 21/67* (2006.01)
*G05B 19/418* (2006.01)

(52) U.S. Cl.
CPC .......... *H01L 21/6773* (2013.01); *B65G 49/07* (2013.01); *G05B 19/41865* (2013.01); *H01L 21/67276* (2013.01); *H01L 21/68* (2013.01); *G05B 2219/2602* (2013.01); *G05B 2219/45031* (2013.01); *G05B 2219/45032* (2013.01)

(58) Field of Classification Search
CPC .............. B65G 49/07; G05B 19/41865; G05B 2219/2602; G05B 2219/45031; G05B 2219/45032; H01L 21/67167; H01L 21/67276; H01L 21/6773; H01L 21/67745; H01L 21/68
See application file for complete search history.

(56) References Cited

U.S. PATENT DOCUMENTS

2004/0069226 A1* 4/2004 Yoshida ............ H01L 21/67178
156/345.31
2009/0087287 A1* 4/2009 Yu ..................... H01L 21/67772
414/217.1

(Continued)

FOREIGN PATENT DOCUMENTS

JP H08-340040 A 12/1996

*Primary Examiner* — Kidest Bahta
(74) *Attorney, Agent, or Firm* — Venjuris, P.C.

(57) ABSTRACT

A semiconductor manufacturing apparatus includes one or more process modules, a scheduler, and a transfer controller. A product wafer of a lot that is transferred from a load port to one of the one or more process modules is replenished such that a total number of wafers that are simultaneously processed in the one or more process modules becomes N. When an advance lot being processed and a post lot to be processed subsequent to the advance lot have a same processing condition, the scheduler creates the transfer plan to replenish with the product wafer of the post lot instead of a dummy wafer such that the transfer controller transfers the product wafer and the dummy wafer to the one or more process modules according to the created transfer plan.

11 Claims, 13 Drawing Sheets

(56) References Cited

U.S. PATENT DOCUMENTS

| | | | |
|---|---|---|---|
| 2011/0206486 A1* | 8/2011 | Matsuyama | H01L 21/67225 |
| | | | 414/806 |
| 2014/0161571 A1* | 6/2014 | Hiraide | H01L 21/67167 |
| | | | 414/217.1 |
| 2020/0144084 A1* | 5/2020 | Ikeda | H01L 21/324 |

* cited by examiner

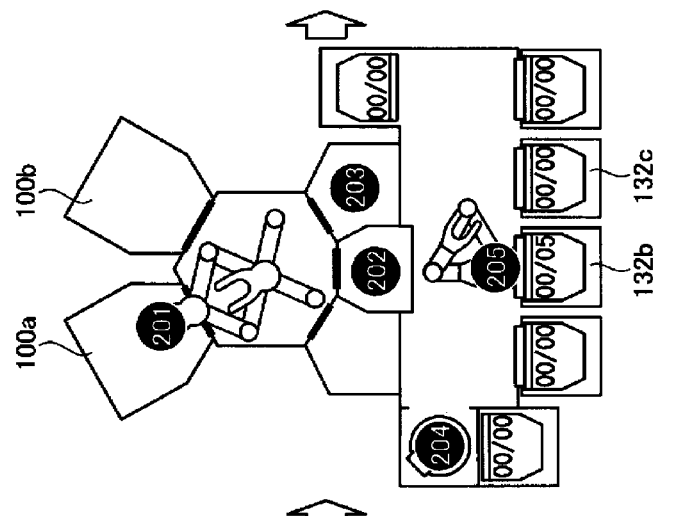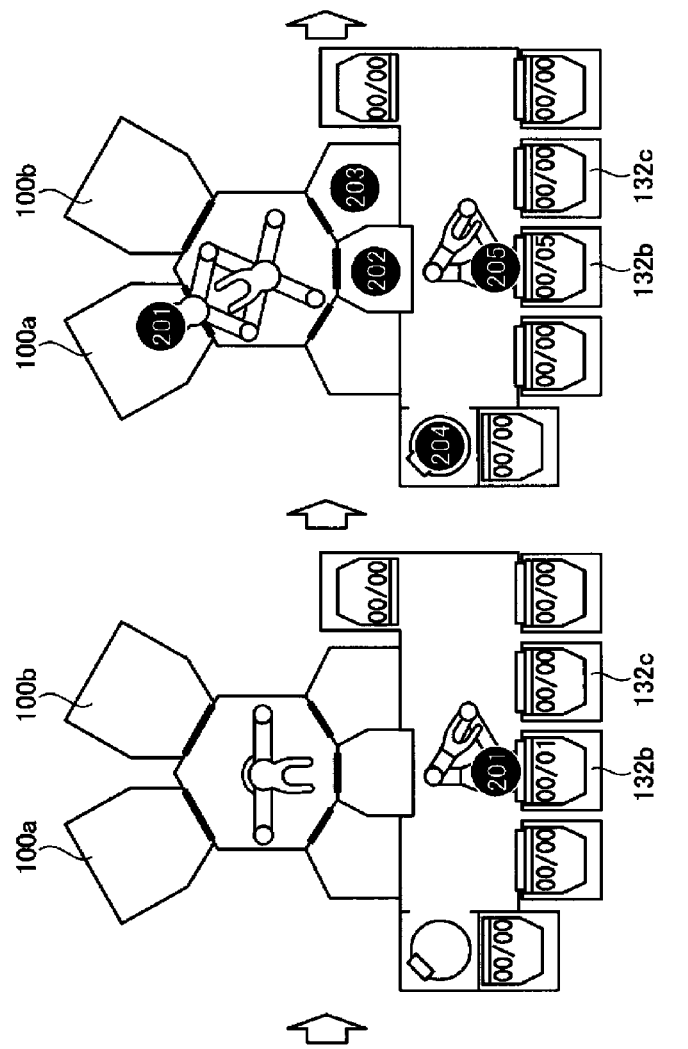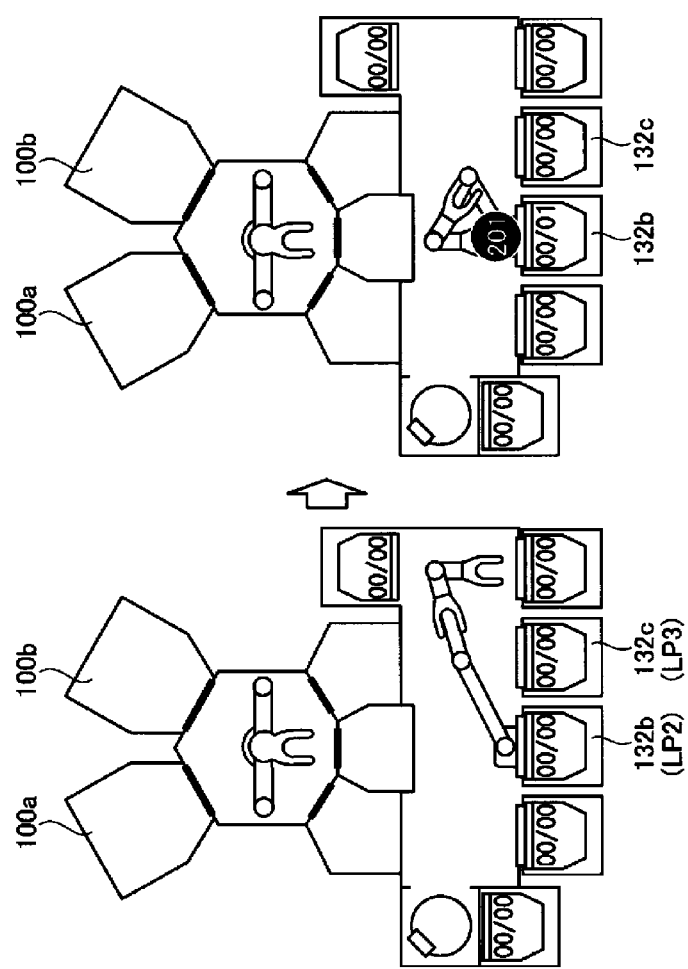

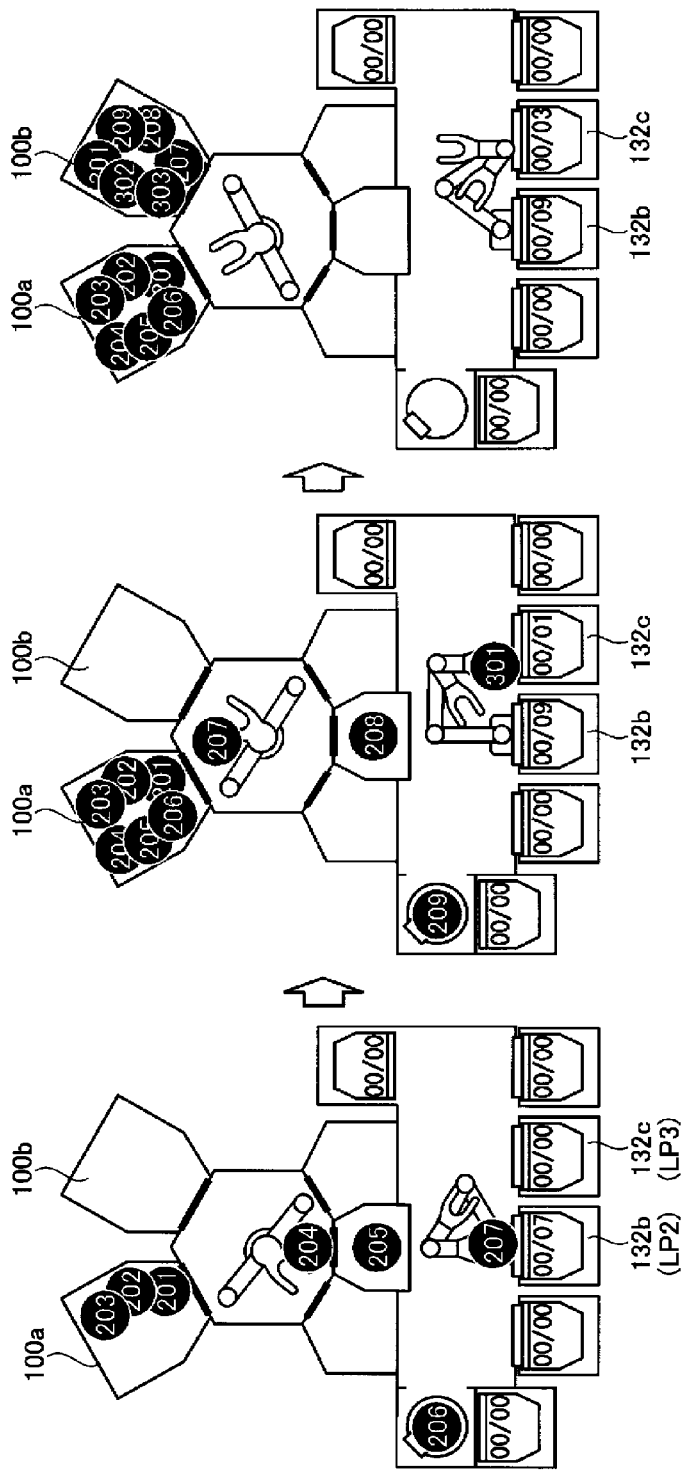

FIG. 10

FUNCTIONAL VALID CONDITION

| CONDITION OF ADVANCE LOT | CONDITION OF POST LOT |
|---|---|
| 1. 1CJ1PJ<br>2. NOT LOT STARTED FROM DUMMY PORT<br>3. EPILOGUE IS NOT PLANNED TO BE EXECUTED<br>4. PM SLOT IS NOT DESIGNATED | 1. THE NUMBER OF WAFERS TO BE PROCESSED IS LARGER THAN OR EQUAL TO THE NUMBER OF INSUFFICIENT WAFERS<br>2. 1CJ1PJ<br>3. SYSTEM RECIPE IS SAME AS THAT OF ADVANCE LOT<br>4. PROLOGUE IS NOT PLANNED TO BE EXECUTED<br>5. PM SLOT IS NOT DESIGNATED<br>6. CJ OF POST LOT HAS BEEN GENERATED AT TIME OF PLANNING LASTGROUP OF ADVANCE LOT |

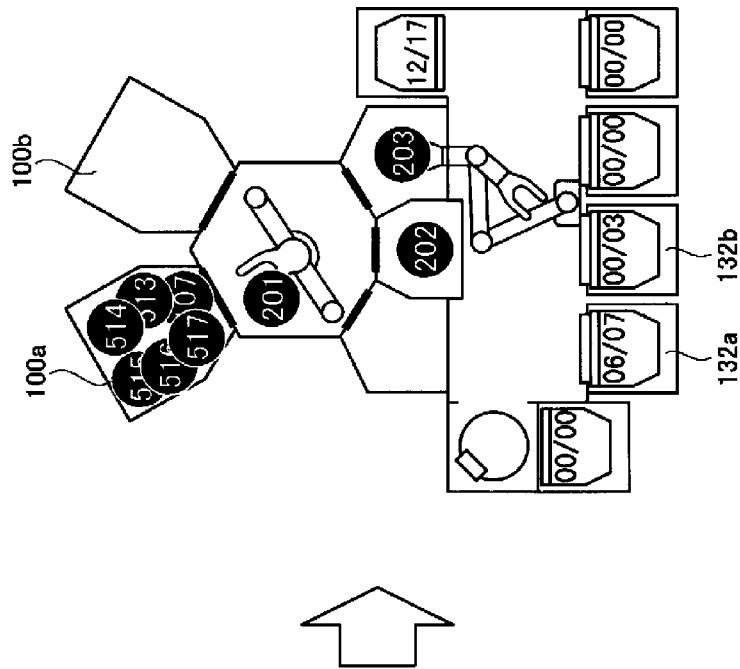
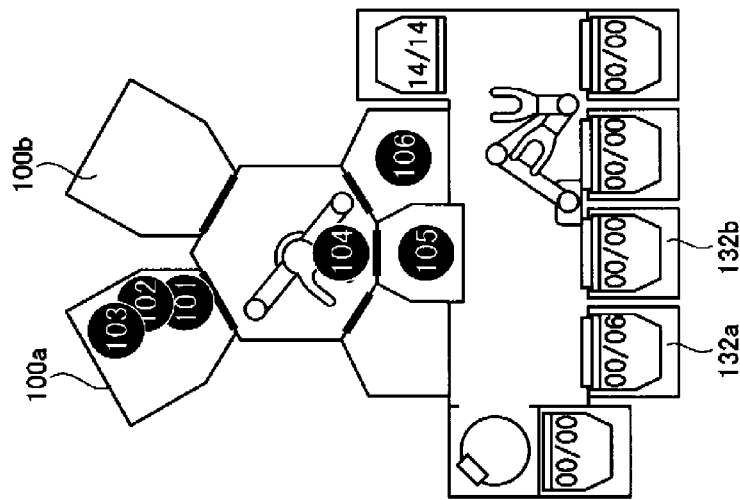
FIG. 11

SEMICONDUCTOR MANUFACTURING APPARATUS AND METHOD FOR TRANSFERRING WAFER

CROSS-REFERENCE TO RELATED APPLICATIONS

This application is based on and claims priority from Japanese Patent Application No. 2020-045740 filed on Mar. 16, 2020 with the Japan Patent Office, the disclosure of which is incorporated herein in its entirety by reference.

TECHNICAL FIELD

The present disclosure relates to a semiconductor manufacturing apparatus and a method for transferring a wafer.

BACKGROUND

In a semiconductor manufacturing apparatus in the related art, for example, in a wafer transporting method in which wafers loaded in a plurality of cassettes are transported from the cassettes to a boat holding the wafers in a multiple tiers, the shortage of wafers on the boat is replenished with dummy wafers in order to perform the processing of the wafer under the same conditions (e.g., the number of the wafers on the boat or arrangement) (e.g., see Japanese Laid-Open Patent Publication No. 08-340040).

SUMMARY

An aspect of the present disclosure is a semiconductor manufacturing apparatus including at least one process modules configured to simultaneously process a group of N (N≥2) wafers; a scheduler configured to create a transfer plan of the wafers; and a transfer controller configured to control a wafer transfer of the group of N (N≥2) wafers. A product wafer of a lot that is transferred from a load port to one of the one or more process modules is replenished such that a total number of wafers that are simultaneously processed in the one or more process modules becomes N. When an advance lot being processed and a post lot to be processed subsequent to the advance lot have a same processing condition, the scheduler creates the transfer plan to replenish with the product wafer of the post lot instead of a dummy wafer such that the transfer controller transfers the product wafer and the dummy wafer to the one or more process modules according to the created transfer plan.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 7A to 7F are views of an example for explaining an operation example of a "same product wafer replenishing function."

FIG. 10 is a view for explaining an example of functional valid conditions of the "same product wafer replenishing function."

FIG. 11 is a view for explaining an example in which the same product wafer replenishing function is not operated because the condition of a post lot is not satisfied.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described with reference to the drawings.

[System Configuration]

Figure 1:
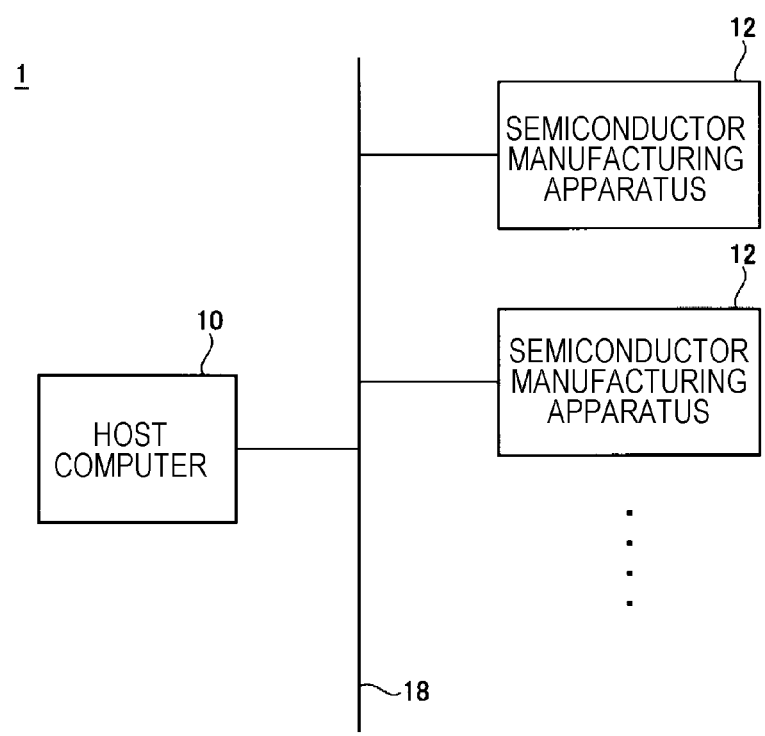
FIG. 1 is a configuration view of an example of an information processing system according to the present embodiment.

FIG. 1 is a configuration view of an example of an information processing system according to the present embodiment. In an information processing system 1 illustrated in FIG. 1, a host computer 10 and one or more semiconductor manufacturing apparatuses 12 are connected via a communicable network 18 such as a local area network (LAN).

The host computer 10 is an example of a man-machine interface (MMI) that provides information on the semiconductor manufacturing apparatus 12 to an operator. The host computer 10 receives a parameter setting such as a system parameter setting from the operator. Further, the host computer 10 receives an instruction with respect to product management (lot management) or production management (batch management) from the operator.

According to a job execution request from the host computer 10, the semiconductor manufacturing apparatus 12 transfers a wafer, which is a process target, to a process module (to be described later), and performs the process having characteristics according to the process module. In the present embodiment, the wafer transferred to the process module includes a product wafer that is lot-controlled, and a dummy wafer that fills a vacant slot of the process module. The name of the dummy wafer is an example, and may have another name such as a monitor wafer or a test wafer.

Further, the information processing system 1 in FIG. 1 is an example, and it goes without saying that there are various examples of a system configuration depending on the application or purpose. The distinction of devices such as the host computer 10 and the semiconductor manufacturing apparatus 12 in FIG. 1 is an example.

For example, the information processing system 1 may have various configurations such as a configuration in which the host computer 10 and the semiconductor manufacturing apparatus 12 are integrated or a further divided configuration. Further, the host computer 10 may treat a plurality of semiconductor manufacturing apparatuses 12 integrally as in the information processing system 1 in FIG. 1, or may be provided one-to-one with the semiconductor manufacturing apparatus 12.

[Hardware Configuration]

Figure 2:
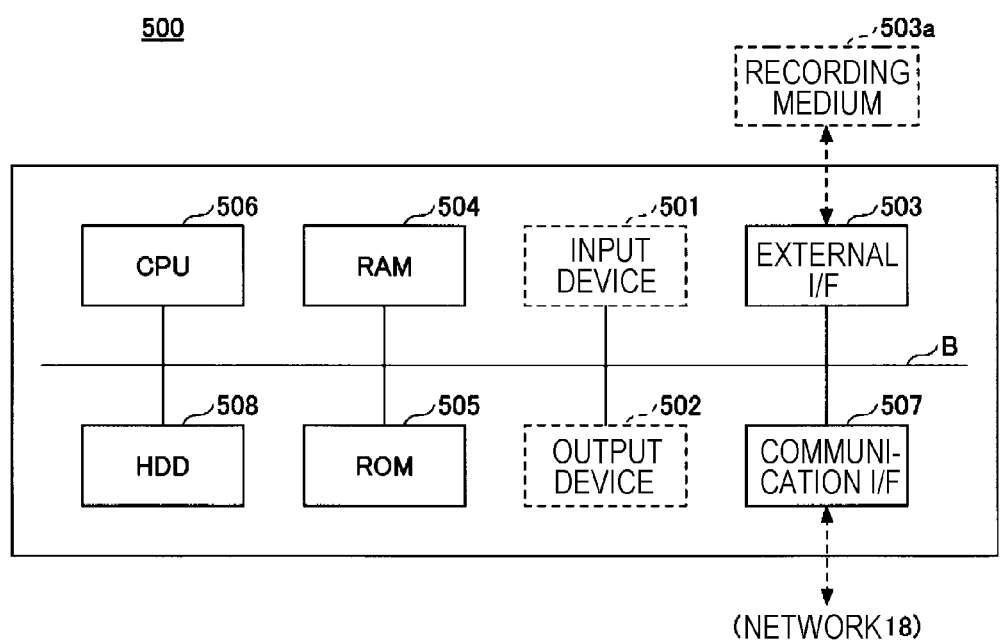
FIG. 2 is a hardware configuration view of an example of a compute.

The host computer 10 of the information processing system 1 illustrated in FIG. 1 is implemented by, for example, a computer having a hardware configuration illustrated in FIG. 2. FIG. 2 is a hardware configuration view of an example of a compute.

A computer 500 in FIG. 2 includes, for example, an input device 501, an output device 502, an external interface (I/F) 503, a random access memory (RAM) 504, a read only memory (ROM) 505, a central processing unit (CPU) 506, a communication I/F 507, and a hard disk drive (HDD) 508, which are connected to each other via bus B. The input device 501 and the output device 502 may connected to use when necessary.

The input device 501 is, for example, a keyboard or a mouse, or a touch panel, and is used by, for example, an operator to input each operation signal. The output device 502 is, for example, a display, and displays a processing result by the computer 500. The communication I/F 507 is an interface that connects the computer 500 to a network 18. The HDD 508 is an example of a non-volatile storage device that stores a program or data.

The external I/F 503 is an interface with an external device. The computer 500 may read and/or write to a recording medium 503a such as a secure digital (SD) memory card via the external I/F 503. The ROM 505 is an example of a non-volatile semiconductor memory (a storage device) that stores a program or data. The RAM 504 is an example of a volatile semiconductor memory (a storage device) that temporarily retains a program or data.

The CPU 506 is an arithmetic device that reads out a program or data from the storage device such as the ROM 505 or the HDD 508 onto the RAM 504 and executes a process so as to implement control or functions of the entire computer 500.

The host computer 10 in FIG. 1 may implement various functions by, for example, the hardware configuration of the computer 500 in FIG. 2

Figure 3:
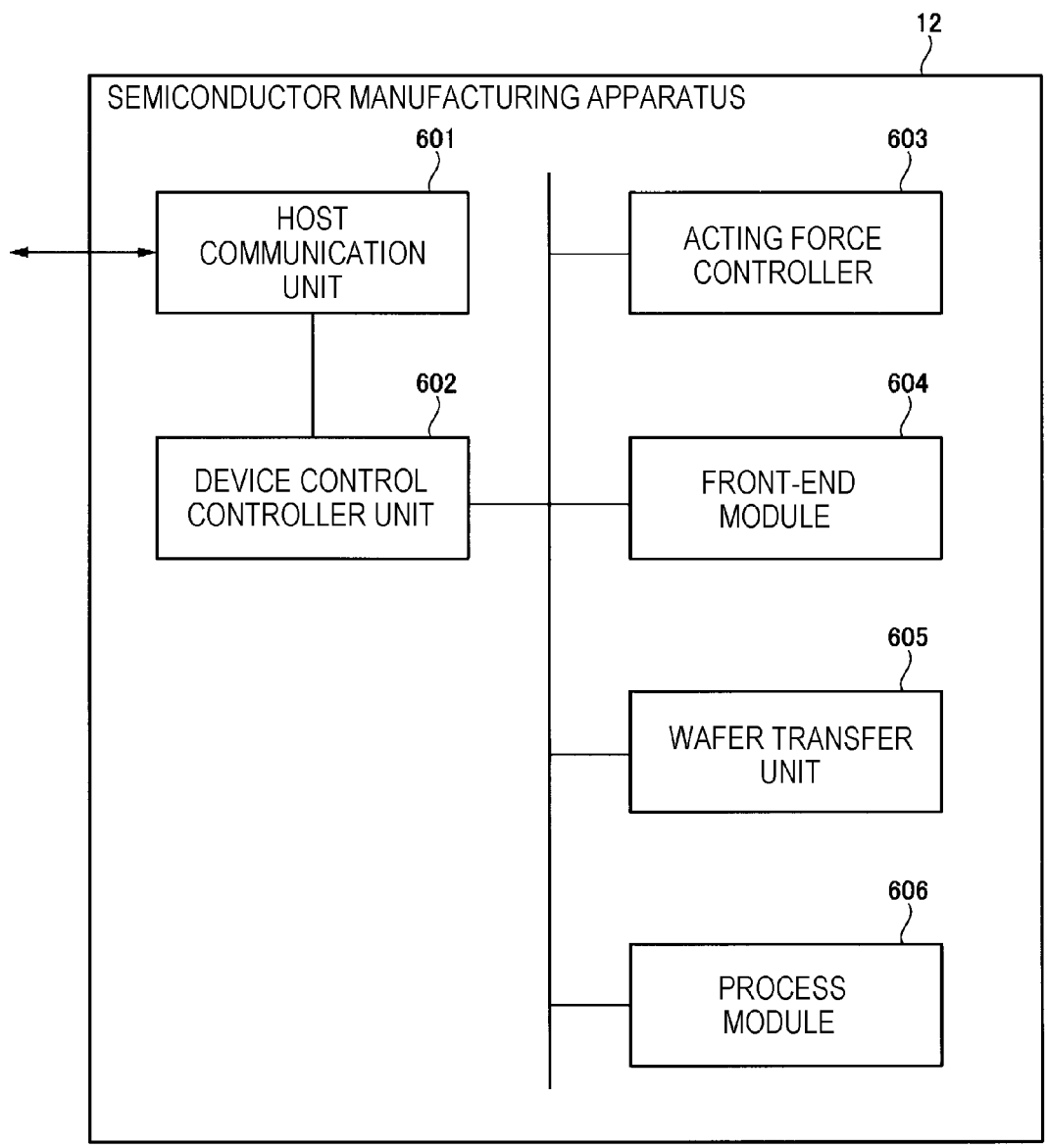
FIG. 3 is a hardware configuration view of an example of a semiconductor manufacturing apparatus.

Further, the semiconductor manufacturing apparatus 12 of the information processing system 1 illustrated in FIG. 1 is implemented by, for example, a hardware configuration illustrated in FIG. 3. FIG. 3 is a hardware configuration view of an example of the semiconductor manufacturing apparatus.

The semiconductor manufacturing apparatus 12 in FIG. 3 is configured to include a host communication unit 601, a device control controller unit 602, an acting force controller 603, a front-end module 604, a wafer transfer unit 605, and a process module 606.

The host communication unit 601 is an interface with the host computer 10. The device control controller unit 602 communicates with the host computer 10 via the host communication unit 601. The device control controller unit 602 controls the acting force controller 603, the front-end module 604, the wafer transfer unit 605, and the process module 606 in accordance with, for example, various requests received from the host computer 10.

The acting force controller 603 is configured to control the acting force (e.g., electric power, water, and gas required for manufacturing a product). The front-end module 604 is configured to include a load port that is an interface portion that supplies a wafer to the semiconductor manufacturing apparatus 12. The load port is a portion that introduces the wafer into the semiconductor manufacturing apparatus 12 from the outside or takes out the wafer from the inside of the semiconductor manufacturing apparatus 12 to the outside. The load port introduces a carrier of wafer such as a front opening unified pod (FOUP) transmitted from the previous process to the semiconductor manufacturing apparatus 12.

The wafer transfer unit 605 is configured by, for example, a transfer robot or a transporter that transfers the wafer between the load port and the process module 606. The process module 606 is configured to include a reaction container such as a chamber or processing chamber capable of processing a plurality of wafers at the same time. The semiconductor manufacturing apparatus 12 in FIG. 1 may implement various functions (to be described later) by, for example, the hardware configuration in FIG. 3.

[Functional Configuration]

Figure 4:
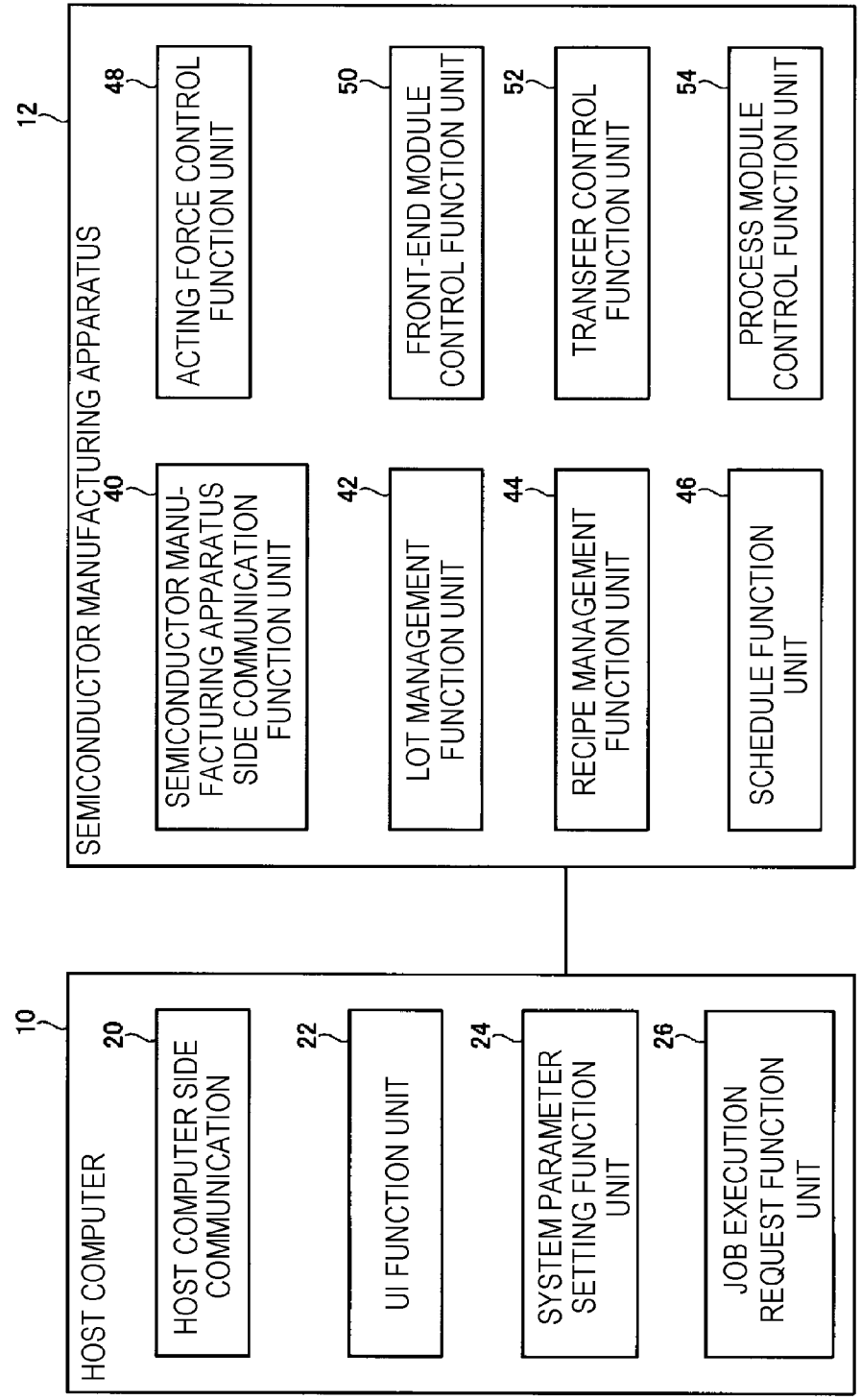
FIG. 4 is a functional block diagram of an example of the information processing system according to the present embodiment.

The host computer 10 and the semiconductor manufacturing apparatus 12 of the information processing system 1 according to the present embodiment is implemented by, for example, a functional block in FIG. 4. FIG. 4 is a functional block diagram of an example of the information processing system according to the present embodiment. In the functional block diagram in FIG. 4, illustrations of configurations unnecessary for the description of the present embodiment are omitted.

The host computer 10 executes a program for the host computer 10 to implement a host computer side communication function unit 20, a UI function unit 22, a system parameter setting function unit 24, and a job execution request function unit 26.

The host computer side communication function unit 20 communicates with the semiconductor manufacturing apparatus 12. The UI function unit 22 provides a user interface (UI) to an operator. The system parameter setting function unit 24 receives a system parameter setting (to be described later) from the operator. Further, the job execution request function unit 26 requests the semiconductor manufacturing apparatus 12 to execute a job in accordance with instructions with respect to the product management (lot management) or the production management (batch management) from the operator.

The semiconductor manufacturing apparatus 12 executes a program for the semiconductor manufacturing apparatus 12 to implement a semiconductor manufacturing apparatus side communication function unit 40, a lot management function unit 42, a recipe management function unit 44, a schedule function unit 46, an acting force control function unit 48, a front-end module control function unit 50, a transfer control function unit 52, and a process module control function unit 54.

The semiconductor manufacturing apparatus side communication function unit 40 communicates with the host computer 10. The lot management function unit 42 performs the lot management and the batch management in accordance with the request for the job execution from the host computer. The recipe management function unit 44 manages the processing conditions of the process for the wafers, such as a command, a setting, and a parameter for the semiconductor manufacturing apparatus 12 as a recipe.

The schedule function unit 46 creates a transfer plan for the wafers (product wafers and dummy wafers). The transfer plan for the wafer indicates the transfer order or the transfer path when the wafer is transferred between the load port and the process module 606.

The acting force control function unit 48 controls the acting force controller 603 in accordance with, for example, the recipe. The front-end module control function unit 50 controls the front-end module 604 in accordance with, for example, the transfer plan. The transfer control function unit 52 controls the wafer transfer unit 605 such that the wafer is transferred between the load port and the process module 606 in accordance with, for example, the transfer plan. The process module control function unit 54 controls the process module 606 in accordance with, for example, the recipe to process the wafer loaded in the slot of the process module 606.

[Processing]

Figure 5:
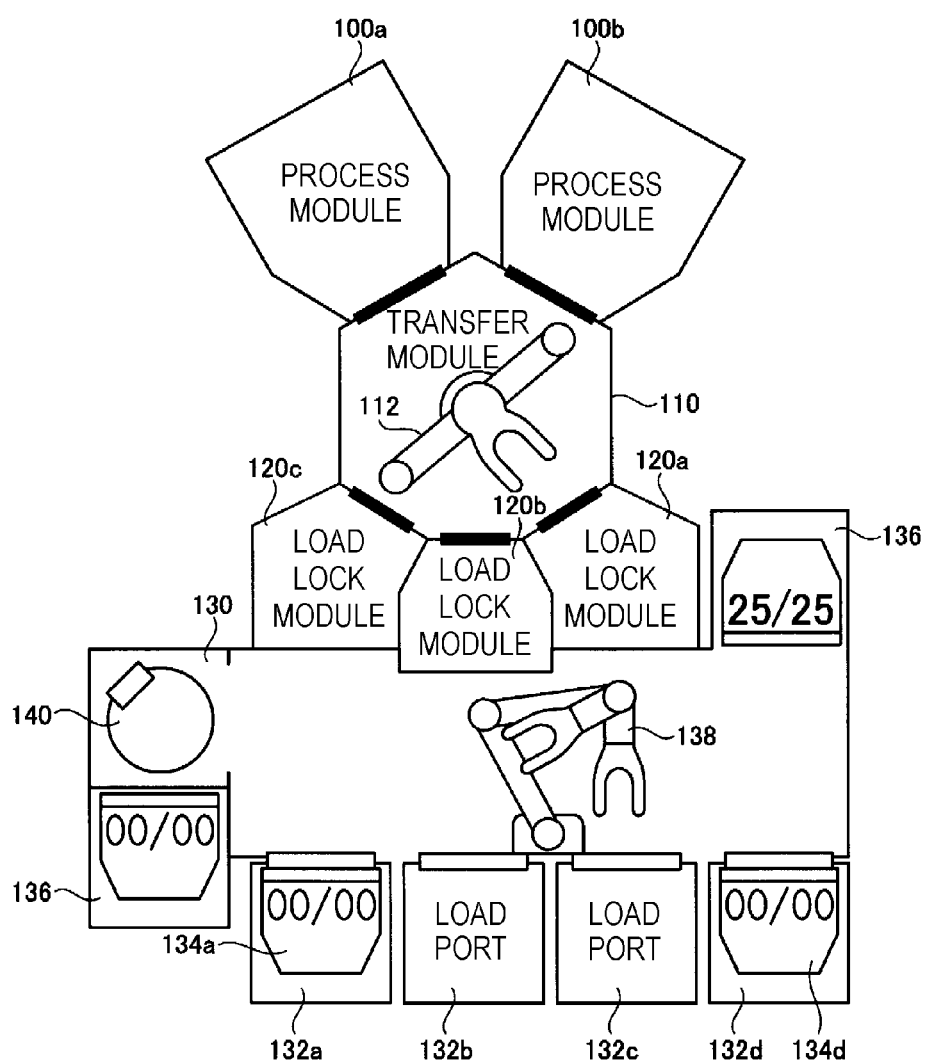
FIG. 5 is a view of an example for explaining an outline of wafer transfer in the semiconductor manufacturing apparatus according to the present embodiment.

FIG. 5 is a view of an example for explaining an outline of wafer transfer in the semiconductor manufacturing apparatus according to the present embodiment. The semiconductor manufacturing apparatus 12 in FIG. 5 includes two process modules 100a and 100b. The process modules 100a and 100b include a plurality of slots (e.g., six or the like), respectively. The process modules 100a and 100b simultaneously process the wafer transferred according to the transfer plan and loaded in the slot. Hereinafter, descriptions will be made on an example in which the process modules 100a and 100b have six slots, respectively.

The semiconductor manufacturing apparatus 12 in FIG. 5 includes four load ports 132a to 132d. A FOUP, which is an example of a wafer carrier, may be placed in each of the load ports 132a to 132d. FIG. 5 illustrates an example in which a FOUP 134a is placed in the load port 132a and a FOUP 134d is placed in the load port 132d. In the description in the following, the FOUP placed in the load ports 132a to 132d will be separately referred to as the FOUPs 134a to 134d.

In the FOUP, the product wafer corresponding to the lot managed by the lot management function unit 42 is stored so as to be able to taken out by a loader arm 138. "00/00" illustrated in the FOUPs 134a and 134d in FIG. 5 refers to "the number of the wafers returned to FOUP/the number of wafers carried out from FOUP."

A loader module 130 of the semiconductor manufacturing apparatus 12 in FIG. 5 includes the load ports 132a to 132d, dummy wafer stockers 136, a loader arm 138, and an oriental unit 140. In the dummy wafer stocker 136, a dummy wafer is stored so as to be taken out by the loader arm 138. The oriental unit 140 is used to perform positional alignment by rotating the wafer.

The product wafer is taken out from the FOUP in the load ports 132a to 132d by the loader arm 138, and, after performing the positional alignment by the oriental unit 140, is loaded in the slot of the process module 100a or 100b via any one of load lock modules 120a to 120c, and a transfer module arm 112 of a transfer module 110.

Figure 6A:
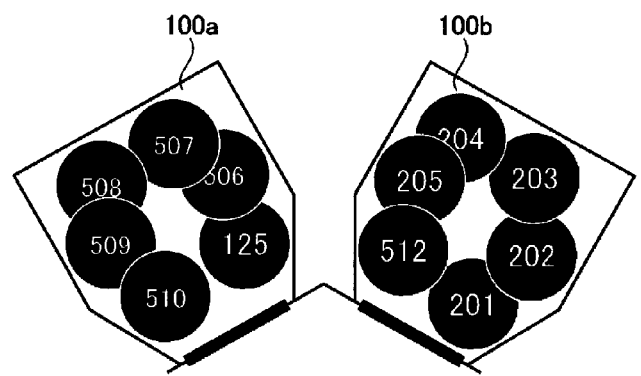
FIGS. 6A and 6B are views of examples for explaining a product wafer and a dummy wafer loaded in a process module.
Figure 6B:
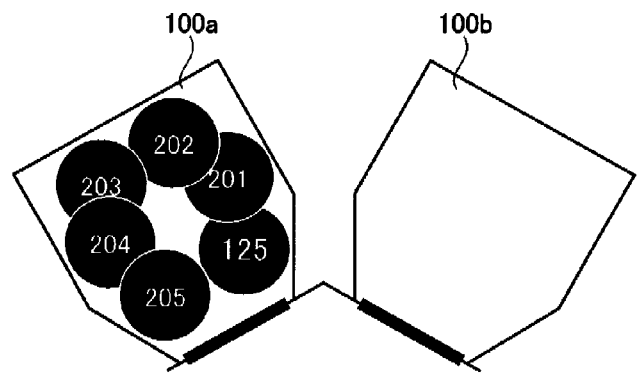

For example, as illustrated in FIGS. 6A and 6B, the product wafer and the dummy wafer are loaded in the process modules 100a and 100b. FIGS. 6A and 6B are views of examples for explaining the product wafers and the dummy wafers loaded in the process module. In FIGS. 6A and 6B, an example in which a same recipe is used in the consecutive lot, the number of the produce wafers of the advance lot is 25, and the number of the wafers of the post lot is five.

It is assumed that the product wafer of the advance lot is stored, for example, in the FOUP 134a in the load port 132a. Further, it is assumed that the product wafer of the post lot is stored, for example, in the FOUP 134d in the load port 132b. A three-digit number is given to the product wafers and dummy wafers in FIGS. 6A and 6B, and the load ports 132a to 132d from which the product wafers are taken out, or the dummy wafer stocker 136 from which the dummy wafers are taken out may be identified by the hundreds digit. Further, the tens place and the units place of the three-digit number given to the product wafer in FIGS. 6A and 6B are serial numbers of the product wafer given to each lot. Further, the tens digit and the ones digit given to the dummy wafers in FIGS. 6A and 6B are serial numbers of the dummy wafers.

FIGS. 6A and 6B illustrate the examples in which "1" is given to the hundreds digit of the product wafer taken out from the load port 132a, and "2" is given to the hundreds digit of the product wafer taken out from the load port 132b. Further, the examples in which "5" is given to the hundreds digit of the dummy wafer taken out from the dummy wafer stocker 136 are illustrated. For example, the wafer to which a three-digit number "125" is given refers to a product wafer having the serial number "25" taken out from the load port 132a. The wafer to which a three-digit number "205" is given refers to a product wafer having the serial number "5" taken out from the load port 132b. The wafer to which a three-digit number "506" is given refers to a dummy wafer having the serial number "6" taken out from the dummy wafer stocker 136.

For example, in a case of a lot having 25 product wafers, the semiconductor manufacturing apparatus 12 divides the 25 product wafers into wafer groups having six wafers respectively, and processed in the order in the process module 100a or 100b. Therefore, the last wafer group is constituted by one product wafer having the serial number "25," and thus, as illustrated in the process module 100a in FIG. 6A, the empty slots are filled with dummy wafers having the serial numbers "6" to "10."

Further, for example, in a case of a lot having five product wafers, the number of the product wafers is less than six, which is required for the wafer group, and thus, as illustrated in the process module 100b in FIG. 6A, the empty slots are filled with a dummy wafer having a serial number "12." In the example in FIG. 6A, when the number of the product wafers corresponding to the lot is not a multiple of six, dummy wafers are always used.

Therefore, in the semiconductor manufacturing apparatus 12 according to the present embodiment, as illustrated in FIG. 6B, when the post lot subsequent to the advance lot has the same recipe, the product wafer of the post lot is used instead of the dummy wafer under predetermined valid conditions. For example, in FIG. 6B, five empty slots of the last wafer group of the advance lot is replenished with five product wafers of the post lot instead of the dummy wafers.

Therefore, in the semiconductor manufacturing apparatus 12 according to the present embodiment, the number of the dummy wafers used may be reduced, and a turn around time (TAT) may be improved by the increase of the number of the process wafers that are process processed.

The function of using the product wafer of the post lot instead of the dummy wafer (hereinafter, the same product wafer replenishing function) may be switched between invalid and valid.

For example, as illustrated in FIGS. 7A to 7F, when the product wafers of the last wafer group of the advance lot are insufficient, the semiconductor manufacturing apparatus 12 in which the "same product wafer replenishing function" is valid uses the product wafers of the post lot for replenishment instead of the dummy wafers.

FIGS. 7A to 7F are views of an example for explaining an operation example of the "same product wafer replenishing function." FIG. 7A illustrates an example in which a FOUP in which nine product wafers are stored is placed in the load port 132b, and a FOUP in which three product wafers are stored is placed in the load port 132c. The operator manipulates the host computer 10 to start a job execution by designating the same recipe for the lot (advance lot) corresponding to the nine product wafers in the load port 132b and the lot (post lot) corresponding to the three product wafers in the load port 132c.

FIG. 7B illustrates a state in which the "201" product wafer is taken out from the FOUP in the load port 132b. The product wafer taken out from the FOUP in the load port 132b is transferred toward the process module 100a via the loader arm, the oriental unit, the load lock module, and the transfer module arm 112 of the transfer module 110.

FIG. 7C illustrates a state in which, subsequent to the "201" wafer product, the "202" to "205" product wafers are sequentially taken out from the FOUP in the load port 132b, and are transferred toward the process module 100a via the loader arm, the oriental unit, the load lock module, and the transfer module arm 112 of the transfer module 110.

FIG. 7D illustrates a state in which, subsequent to the "206" product wafer, the "207" product wafer is taken out from the FOUP in the load port 132b. The "207" product wafer taken out from the FOUP in the load port 132b is transferred toward the process module 100b since there in no empty slot in the process module 100a.

FIG. 7E illustrates a state in which, after the "207" to "209" product wafers are taken out from the FOUP in the load port 132b, the "301" product wafer is taken out from the FOUP in the load port 132c, instead of the dummy wafer. Further, FIG. 7E illustrates a state in which the transfer of the six of the "201" to "206" product wafers to the process module 100a is completed.

The process module 100a performs a process according to the recipe on the six of the "201" to "206" product wafers loaded in the slot.

FIG. 7F illustrates a state in which the transfer of the "207" to "209" product wafers taken out from the FOUP in the load port 132b and the "301" to "303" product wafers taken out from the FOUP in the load port 132c to the process module 100b is completed.

The process module 100b performs a process according to the recipe on the "207" to "209" product wafers and the "301" to "303" product wafers loaded in the slot.

Figure 8:
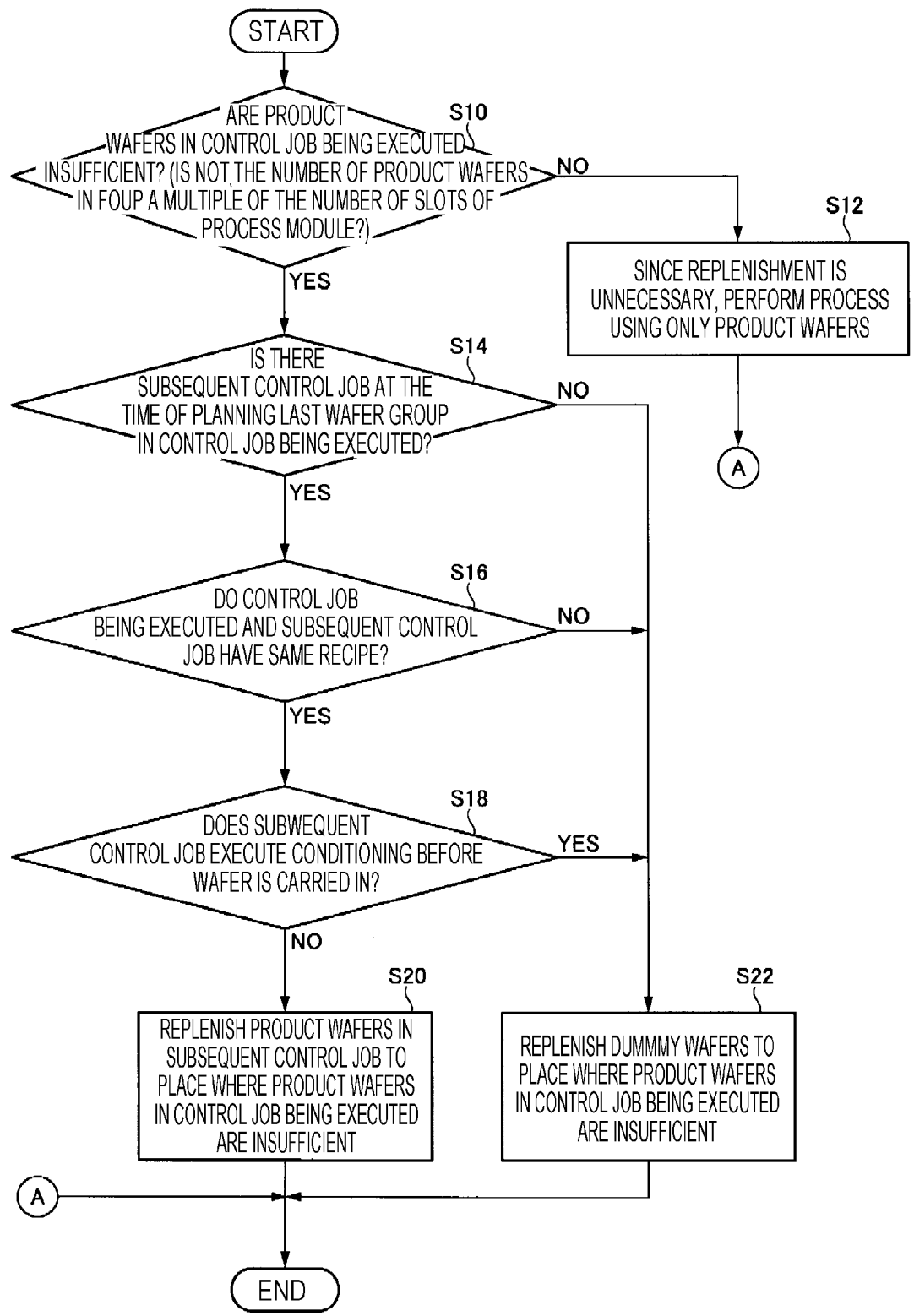
FIG. 8 is a flowchart of an example of a process of creating a transfer plan.

The transfer of the product wafer from the load port as illustrated in FIGS. 7A to 7F to the process module 100a or 100b may be implemented, for example, by creating a transfer plan as illustrated in a flowchart in FIG. 8. In FIG. 8, it is assumed that one control job (CJ) and one process job (PJ) are set for each lot.

The control job is an instruction of a processing unit in the semiconductor manufacturing apparatus 12. The process job is a minimum processing unit in the semiconductor manufacturing apparatus 12, and is a component of the control job.

FIG. 8 is a flowchart of an example of a process of creating a transfer plan. In step S10, the schedule function unit 46 determines whether the product wafer of the wafer group of the advance lot (control job) being executed is insufficient (the number of the product wafers in the FOUP is not a multiple of the number of the slots of the process modules 100a and 100b).

When the product wafer is not insufficient in the control job being executed, the schedule function unit 46 proceeds to step S12 to determine that it is not necessary to replenish the advance lot with the wafer, and create a transfer plan for performing a process using only the product wafers of the advance lot.

When the product wafer of the wafer group in the control job being executed is insufficient, the schedule function unit 46 proceeds to step S14 to determine whether or not there is a post lot (subsequent control job) at the time of planning the wafer group that is the last in the control job being executed.

When there is not a subsequent control job at the time of planning the wafer group that is the last in the control job being executed, the schedule function unit 46 proceeds to step S22 to create a transfer plan for performing a process by replenishing dummy wafers to the place where the product wafers in the control job being executed are insufficient.

When there is a subsequent control job at the time of planning the wafer group that is the last in the control job being executed, the schedule function unit 46 proceeds to step S16 to determine whether or not the control job being executed and the subsequent control job have the same recipe.

When the control job being executed and the subsequent control job do not have the same recipe, the schedule function unit 46 proceeds to step S22 to create a transfer plan for performing a process by replenishing dummy wafers to the place where the product wafers in the control job being executed are insufficient.

When the control job being executed and the subsequent control job have the same recipe, the schedule function unit 46 proceeds to step S18 to determine whether or not the subsequent control job executes conditioning before the wafer is carried in. When the subsequent control job executes the conditioning before the wafer is carried in, the schedule function unit 46 proceeds to step S22 to create a transfer plan for performing a process by replenishing dummy wafers to the place where the product wafer in the control job being executed is insufficient. Further, when the subsequent control job does not execute the conditioning before the wafer is carried in, the schedule function unit 46 proceeds to step S20.

In step S20, the schedule function unit 46 creates a transfer plan for performing a process by replenishing the product wafer in the subsequent control job to the place where the product wafer in the control job being executed is insufficient.

Figure 9:
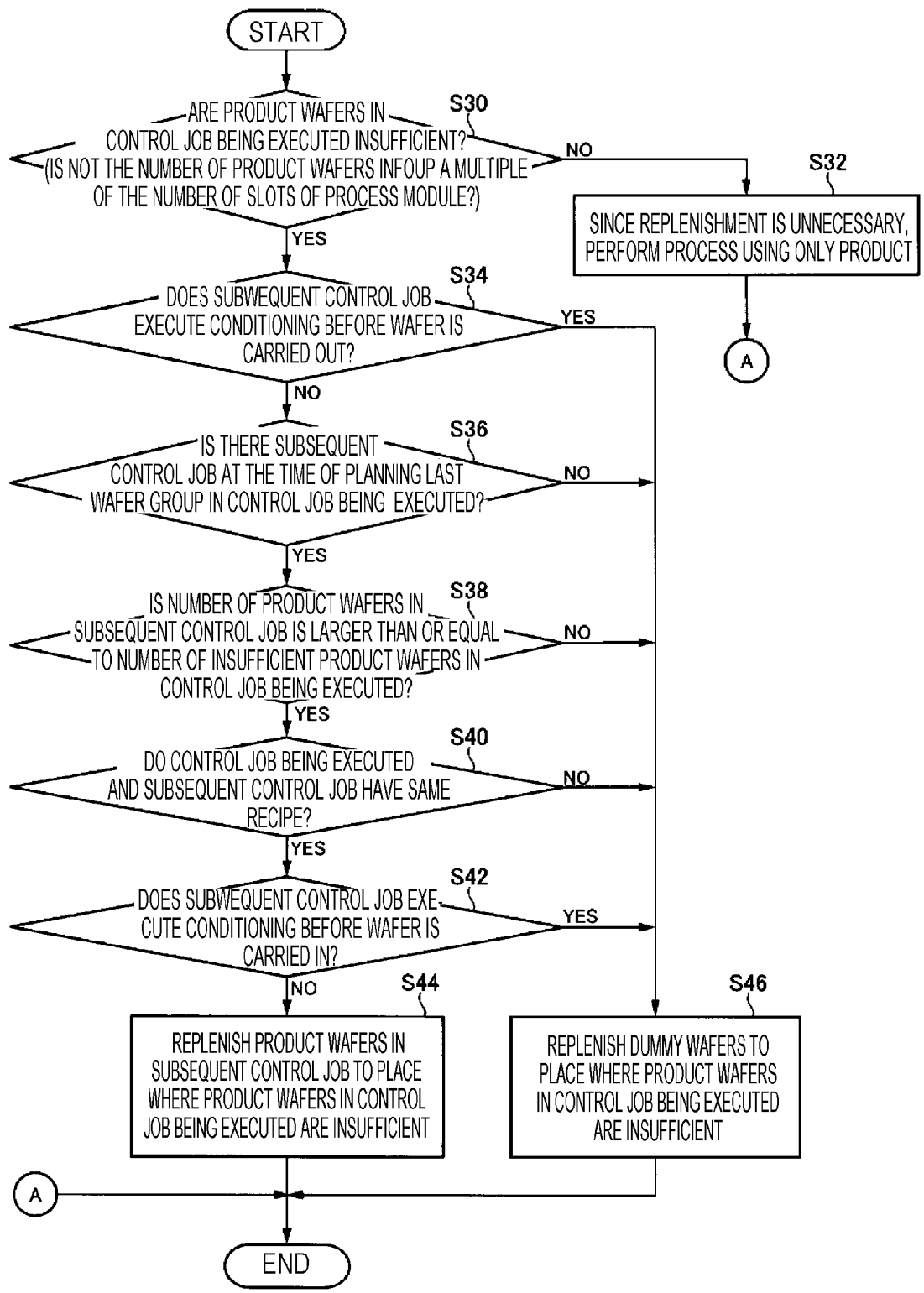
FIG. 9 is a flowchart of another example of a process of creating a transfer plan.

The process of creating the transfer plan in FIG. 8 may be implemented, for example, as illustrated in FIG. 9. FIG. 9 is a flowchart of another example of a process of creating a transfer plan. Since the processing procedure in FIG. 9 is the same as the flowchart in FIG. 8 except for a part, the description thereof will be omitted as appropriate.

Since steps S30 to S32 are the same as steps S10 to S12 in FIG. 8, the description thereof will be omitted. When the product wafer of the wafer group in the control job being executed is insufficient, the schedule function unit 46 proceeds to step S34 to determine whether or not the control job being executed performs conditioning after the wafer is carried out. When the control job being executed executes the conditioning after the wafer is carried out, the schedule function unit 46 proceeds to step S46 to create the transfer plan for performing a process by replenishing dummy wafers to the place where the product wafers in the control job being executed are insufficient.

Further, when the control job being executed does not execute the conditioning after the wafer is carried out, the schedule function unit 46 proceeds to step S36. Since step S36 is the same as step S14 in FIG. 8, the description thereof will be omitted.

When there is a subsequent control job at the time of planning the wafer group that is the last in the control job being executed, the schedule function unit 46 proceeds to step S38 to determine whether or not the number of the product wafers in the subsequent control job is larger than or equal to the number of the insufficient product wafers in the control job being executed.

When the number of the product wafers in the subsequent control job is not larger than or equal to the number of the insufficient product wafers in the control job being executed, the schedule function unit 46 proceeds to step S46 to create a transfer plan for performing a process by replenishing dummy wafers to the place where the product wafers in the control job n being executed are insufficient.

Further, when the number of the product wafers in the subsequent control job is larger than or equal to the number of the insufficient product wafers in the control job being executed, the schedule function unit 46 proceeds to step S40. Since steps S40 to S44 are the same as steps S16 to S20 in FIG. 8, the description thereof will be omitted.

Except for the flowcharts illustrated in FIG. 8 and FIG. 9, for example, the transfer plan may be created corresponding to the functional valid conditions illustrated in FIG. 10. FIG. 10 is a view for explaining an example of functional valid conditions of the "same product wafer replenishing function." The functional valid conditions illustrated in FIG. 10 are examples, and not all the conditions are necessary, and it is possible to add necessary conditions and delete unnecessary conditions. For example, "CJ of the post lot has been generated at the time of planning the last group of the advance lot," which is the condition of the post lot in FIG. 10 may be deleted. Further, the functional valid conditions illustrated in FIG. 10 include both the conditions of the advance lot and the conditions of the post lot, but may be one of them.

The functional valid conditions in FIG. 10 are examples including the condition of the advance lot and the condition of the post lot. "1CJ1PJ," which is the condition of the advance lot in FIG. 10, is a condition that the lot is constituted by one control job and one process job.

"Not a lot started from the dummy port," which is the condition of the advance lot in FIG. 10, is a condition that the lot is not a control job started from the transfer of the dummy wafer. "Epilogue is not planned to be executed," which is the condition of the advance lot in FIG. 10, is a condition that the conditioning after the wafer is carried out, described in step S34 in FIG. 9, is not planned to be executed. "PM slot is not designated," which is the condition of the advance lot in FIG. 10, is a condition that the process module 100*a* or 100*b* that is the transfer destination of the product wafer is not designated.

"The number of wafers to be processed is larger than or equal to the number of the insufficient wafers," which is the condition of the post lot in FIG. 10, is a condition that the number of the product wafers in the subsequent control job is larger than or equal to the number of the insufficient wafers in the control job being executed.

"The system recipe is the same as that of the advance lot," which is the condition of the post lot in FIG. 10, is a condition that the recipes of the control job being executed and the subsequent control job in step S16 illustrated in FIG. 8 or in step S40 illustrated in FIG. 9 are the same as each other.

"Prologue is not planned to be executed," which is the condition of the post lot in FIG. 10, is a condition that the conditioning before the wafer is carried in, described in step S18 in FIG. 8 or in step S42 in FIG. 9, is not planned to be executed.

Further, "CJ of the post lot has been generated at the time of planning the last group of the advance lot," which is the condition of the post lot in FIG. 10, is a condition that there is the control job of the post lot at the time of planning the wafer group that is the last in the control job being executed, described in step S14 in FIG. 8 or in step S36 in FIG. 9.

For example, in the semiconductor manufacturing apparatus 12 according to the present embodiment, when the lot having 13 product wafers is executed, the last wafer group has one product wafer, and thus, the number of the insufficient wafers is five. The transfer plan for the last wafer group is created at the time when all the wafers of the wafer group before the number of the product wafer is one are carried out from the load port.

As a result, when there is no post lot at the time when all the wafers of the wafer group before the number of the product wafer is one are carried out from the load port, the condition of the post lot is not satisfied, and thus, the same product wafer replenishing function is not operated, and a transfer plan is created to perform a process by replenishing dummy wafers to the place where the product wafers of the control job being executed are insufficient.

Figure 12:
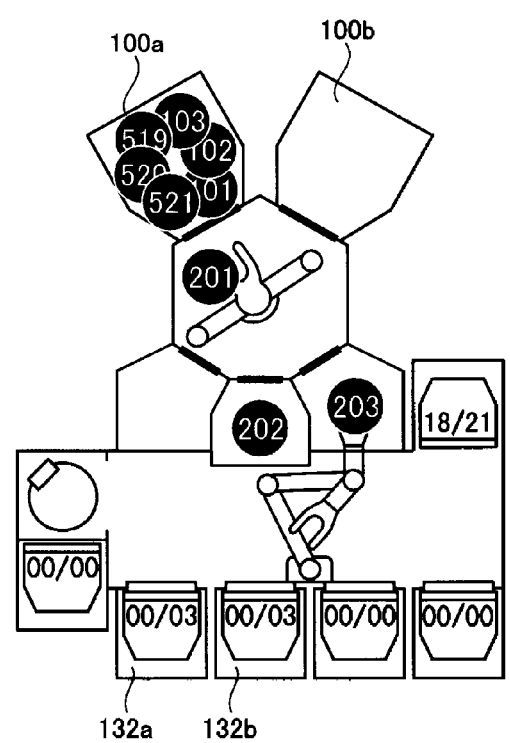
FIG. 12 is a view for explaining an example in which the same product wafer replenishing function is not operated because the condition of a post lot is not satisfied.

FIGS. 11 and 12 are views for explaining examples in which the same product wafer replenishing function is not operated because the condition of the post lot is not satisfied. For example, in FIG. 11, the job execution of the advance lot having seven product wafers is started, and after the sixth product wafer is carried out from the load port 132*a*, the job of the post lot having five product wafers is executed.

The transfer plan for the last wafer group of the advance lot is created at the timing when the last product wafer (sixth product wafer) of the previous wafer group is carried out. As a result, "CJ of the post lot has been generated at the time of planning the last group of the advance lot," which is the condition of the post lot in FIG. 10, is not satisfied.

Therefore, in the example in FIG. 11, the product wafer of the advance lot and the product wafer of the post lot may not be process processed together, which cause the transfer plan that replenishes with five dummy wafers.

Further, in the example in FIG. 12, after the job execution of the advance lot having three product wafers is started, the job of the post lot having three product wafers is executed.

Since the wafer group of the advance lot has one product wafer, and the transfer plan has been created, "CJ of the post lot has been generated at the time of planning the last group of the advance lot," which is the condition of the post lot in FIG. 10, is not satisfied.

Therefore, in the example in FIG. 12, the product wafer of the advance lot and the product wafer of the post lot may not be process processed together, which cause the transfer plan that replenishes with three dummy wafers.

According to the embodiment, it is possible to reduce the number of the dummy wafers used in the semiconductor manufacturing apparatus 12 and to promote improvement of the turn around time by the increase of the number of the process wafers that are process processed.

According to the present disclosure, it is possible to reduce the number of the dummy wafers used in the semiconductor manufacturing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A semiconductor manufacturing apparatus comprising:
one or more process chambers configured to simultaneously process a group of N (N≥2) wafers;
a schedule control circuitry configured to create a transfer plan of the wafers; and
a transfer control circuitry configured to control a wafer transfer of the group of N (N≥2) wafers,
wherein a product wafer of a lot that is transferred from a load port to one of the one or more process chambers is replenished such that a total number of wafers that are simultaneously processed in a first process chamber of the one or more process chambers becomes N, and
when a number of one or more product wafers of an advance lot is insufficient to make a multiple of N and when the advance lot being processed and a post lot to be processed subsequent to the advance lot have a same processing condition, the schedule control circuitry creates the transfer plan to replenish with one or more product wafers of the post lot, instead of a dummy wafer, to be processed simultaneously with the one or more product wafers of the advance lot in the first process chamber such that the transfer control circuitry transfers the product wafer and the dummy wafer to the one or more process chambers according to the created transfer plan.

2. The semiconductor manufacturing apparatus according to claim 1, wherein, when conditioning is scheduled to be executed at an end of the advance lot or conditioning is scheduled to be executed at a start of the post lot, the schedule control circuitry creates the transfer plan to replenish with the dummy wafer even when the advance lot being processed and the post lot subsequent to the advance lot have the same processing condition.

3. The semiconductor manufacturing apparatus according to claim 1, wherein, when there is no post lot when the transfer plan is created for the last wafer group of the advance lot, the schedule control circuitry creates the transfer plan to replenish with the dummy wafer.

4. The semiconductor manufacturing apparatus according to claim 1, wherein, when the number of wafers insufficient to make the number of the product wafers of the advance lot a multiple of N is larger than the number of the product wafers in the post lot, the schedule control circuitry creates the transfer plan to replenish with the dummy wafers.

5. The semiconductor manufacturing apparatus according to claim 1, wherein the advance lot and the post lot are control jobs each created by a request from a host computer and including one process job as a component.

6. The semiconductor manufacturing apparatus according to claim 4, wherein the advance lot and the post lot are control jobs each created by a request from a host computer and including one process job as a component.

7. A wafer transfer method performed in a semiconductor manufacturing apparatus including a process chamber configured to simultaneously perform a processing on a wafer group of N (N≥2) wafers including product wafers in a lot transferred from a load port and dummy wafers replenished to the lot such that the wafer group includes N wafers in total, the method comprising:
creating, when a number of one or more product wafers of an advance lot is insufficient to make a multiple of N and when the advance lot under the processing and a post lot subsequent to the advance lot have the same processing conditions, a transfer plan to replenish the advance lot with one or more product wafers of the post lot instead of the dummy wafers, to be processed simultaneously with the one or more product wafers of the advance lot in the process chamber; and
controlling a wafer transfer device to transfer the product wafers and the dummy wafers to the process chamber according to the transfer plan created in the creating.

8. A wafer transfer method comprising:
providing a semiconductor manufacturing apparatus including one or more process chambers that performs a simultaneous process for a group of N (N≥2) wafers, a schedule control circuitry that creates a transfer plan of the wafers; and a transfer control circuitry that controls a wafer transfer of the group of N (N≥2) wafers;
replenishing a product wafer of a lot that is transferred from a load port to one of the one or more process chambers such that a total number of wafers that are simultaneously processed in a first process chamber of the one or more process chambers becomes N,
when a number of one or more product wafers of an advance lot is insufficient to make a multiple of N and when the advance lot being processed and a post lot to be processed subsequent to the advance lot have a same processing condition, creating the transfer plan to replenish with one or more product wafers of the post lot instead of a dummy wafer, to be processed simultaneously with the one or more product wafers of the advance lot in the first process chamber such that the transfer control circuitry transfers the product wafer and the dummy wafer to the one or more process chambers according to the created transfer plan.

9. The semiconductor manufacturing apparatus according to claim 1, wherein when the one or more product wafers of the post lot are replenished, a total number of the one or more product wafers of the advance lot and the one or more product wafers of the post lot that are simultaneously processed in the first process chamber becomes N.

10. The wafer transfer method according to claim 7, wherein when the one or more product wafers of the post lot are replenished, a total number of the one or more product wafers of the advance lot and the one or more product wafers of the post lot that are simultaneously processed in the process chamber becomes N.

11. The wafer transfer method according to claim 8, wherein when the one or more product wafers of the post lot are replenished, a total number of the one or more product wafers of the advance lot and the one or more product wafers of the post lot that are simultaneously processed in the first process chamber becomes N.

* * * * *